United States Patent
Sasaki et al.

(10) Patent No.: US 8,296,592 B2
(45) Date of Patent: Oct. 23, 2012

(54) SEMICONDUCTOR INTEGRATED CIRCUIT

(75) Inventors: Tsuneki Sasaki, Kanagawa (JP);
Shuichi Kunie, Kanagawa (JP); Tatsuya Kawasaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 353 days.

(21) Appl. No.: 12/662,774

(22) Filed: May 3, 2010

(65) Prior Publication Data
US 2010/0321071 A1    Dec. 23, 2010

(30) Foreign Application Priority Data
Jun. 23, 2009    (JP) .................................. 2009-148913

(51) Int. Cl.
*G06F 1/32* (2006.01)
(52) U.S. Cl. ..................... 713/323; 713/321; 713/322
(58) Field of Classification Search .................. 713/321, 713/322, 323
See application file for complete search history.

(56) References Cited

U.S. PATENT DOCUMENTS

| | | | | |
|---|---|---|---|---|
| 6,085,325 A | * | 7/2000 | Jackson et al. ................. | 713/300 |
| 2006/0236138 A1 | * | 10/2006 | Bieker et al. ................... | 713/300 |
| 2007/0150780 A1 | | 6/2007 | Shimooka | |
| 2008/0072085 A1 | * | 3/2008 | Horiguchi et al. ............. | 713/320 |

FOREIGN PATENT DOCUMENTS
JP    2007-157027    6/2007

* cited by examiner

*Primary Examiner* — Thuan Du
(74) *Attorney, Agent, or Firm* — McGinn IP Law Group, PLLC

(57) ABSTRACT

A resume signal hold circuit holds an assertion of a resume signal instructed while the circuit block is in a stand-by mode. A resume signal mask circuit is provided between the circuit block and the resume signal hold circuit, and masks the signals while the circuit block is in the stand-by mode so that no signal can be input to the circuit block. A power saving control circuit causes the resume signal hold circuit to hold the assertion of the event signal and causes the resume signal mask circuit to mask the signals while the circuit block is in a stand-by mode. The power saving control circuit also causes the resume signal hold circuit to cancel the holding of the assertion of the resume signal after the completion of the resume setting of the circuit block and cancelling of the signal masking by the resume signal mask circuit.

12 Claims, 8 Drawing Sheets

SEMICONDUCTOR INTEGRATED CIRCUIT

INCORPORATION BY REFERENCE

This application is based upon and claims the benefit of priority from Japanese patent application No. 2009-148913, filed on Jun. 23, 2009, the disclosure of which is incorporated herein in its entirety by reference.

BACKGROUND

1. Field of the Invention

The present invention relates to a semiconductor integrated circuit. Specifically, the present invention relates a semiconductor integrated circuit in which processing of internal date is required when returning from a standby state.

2. Description of Related Art

Semiconductor integrated circuits having a low power consumption mode such as a stand-by function or a resume function have been known. When the power-supply is stopped, an internal state is lost except for data stored in a nonvolatile memory. Therefore, the internal state should be retained by temporarily saving the internal state before entering a stand-by state so that the system state can be retained before and after the stand-by state.

For example, Patent document 1 (Japanese Unexamined Patent Application Publication 2007-157027) discloses a semiconductor integrated circuit provided with a function of stopping power supply to target circuits and saving their internal state in a nonvolatile memory before stopping power supply to the target circuits. Then, power supply is restarted in response to an external interrupt signal, and the internal state is restored to the target circuits.

Specifically, when an interrupt signal, which serves as a trigger for the restart of the target circuits (for example, CPU), input to a back-up control circuit, the back up control circuit restarts the power supply by controlling switches. Further, the back-up control circuit brings the target circuits into the recovery state in which a scan-chain is set. Subsequently, the back-up control circuit provides internal node data stored in the back-up memory to the sub scan chain to restore the internal state. When the internal state of the target circuits is recovered, the back-up control circuit cancels the recovery state of the target circuits and restarts the target circuits. The target circuits restart their operations.

In this manner, the internal state of the target circuits is identical before the power-off and after the subsequent power-on. Therefore, even if the power is turned off, continuous data processing can be performed from the same state as before the power-off after the resumption of power supply.

However, during the recovering operation from the standby state, the internal state of the target circuits is different from the normal state and the restore of the internal state has not completed. Therefore, if any operational signal is input to the target circuit at some midpoint in the recovering process, the system would hang up or operate improperly. Therefore, until the recovering process has been completed, the operational signal is masked in order to prevent any input to the target circuits and thereby to avoid the improper operation.

Details are explained hereinafter with reference to FIG. 7. Referring to FIG. 7, the target circuit enters a stand-by mode at a time T00 and resumes a normal operation at a time T02. In this case, signals input to the target circuit is masked during the stand-by mode from the time T00 to the time T02. In other words, as shown in FIG. 7, a signal level of Mask Enable is High from the time T00 to the time T02, and the signal Mask is cancelled at the time T02. As an interrupt command, which serves as a trigger of resumption, is issued at the time T01, the back-up control circuit starts resumption preprocessing for restoring the internal state of the target circuit. Meanwhile, until the time T02 at which the resumption preprocessing has been completed, the interrupt command input to the target circuit is masked. When the resumption preprocessing has been completed and the masking of the signal canceled at the time T02, an operation command is input to the target circuit and the target circuit starts its operation. In this manner, any false operation can be avoided because no external signal is input to the target circuit during the stand-by mode. After the resumption preprocessing has been completed, the target circuit can start to carry out instructed operations properly.

SUMMARY

If the interrupt command, which is externally input during a stand-by state, is a level-detection-type signal, the interrupt command can be detected after the cancelling of the signal mask.

However, if the interrupt command, which is externally input while the mask is in an enable state, is an edge-detection-type (edge-trigger-type) signal, the command could be already disengaged at the time of the restart of the target circuit. For instance, the system reset signal is an edge-detection-type (edge-trigger-type) signal.

Details are explained hereinafter with reference to FIG. 8. In FIG. 8, the target circuit enters stand-by mode at a time T10 and resumes a normal operation at a time T12. In this case, the interrupt command to the target circuit is masked from the time T10 to the time T12. As an interrupt command (for example reset signal) is issued at a time T11, the target circuit starts the resumption preprocessing for restoring the internal state. However, until the time T12 at which the resumption preprocessing has been completed, the mask is in an enable state. At the time T12 at which the mask is canceled, the edge-detection-type command is already disengaged. Therefore, the target circuit cannot detect the command and the externally-instructed operation is never executed. Furthermore, the command is, masked for the target circuit but is input to other circuits which are not in the stand-by mode, so the other circuits execute the commanded operation. Then, synchronization between the target circuit and other circuits will be disrupted.

A first exemplary aspect of the present invention is a semiconductor integrated circuit including:

an circuit block capable of stopping power consumption at a time of an operation-stopped state, and starting an operation and performing a specific process upon receiving a resume event signal instructing a start of an operation;

an power saving control circuit that sets necessary data in the circuit block in the operation-stopped state when the resume event signal is input, the necessary data being required to resume an operation of the circuit block;

an resume signal mask circuit that masks an input of the resume event signal to the circuit block during a period in which the circuit block is in the operation-stopped state and a period in which the power saving control circuit is setting the necessary data in the circuit block;

an resume signal hold circuit that holds a state of the resume event signal at least until after the data has been set in the circuit block and outputs the resume event signal to the circuit block through the resume signal mask circuit if the resume event signal is input during a period in which the circuit block is in the operation-stopped state and a period in which the power saving control circuit is setting the necessary data in the circuit block.

The semiconductor integrated circuit in accordance with an exemplary aspect of the present invention includes the resume signal hold circuit. Therefore, the assertion of the resume event signal can be held until the completion of the resume setting. As a result, the instructed event is reliably executed after the completion of the resume setting and cancelling of the signal masking.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

With reference to the accompany drawings, exemplary embodiments of the present invention will be described.

First Exemplary Embodiment

Figure 1:
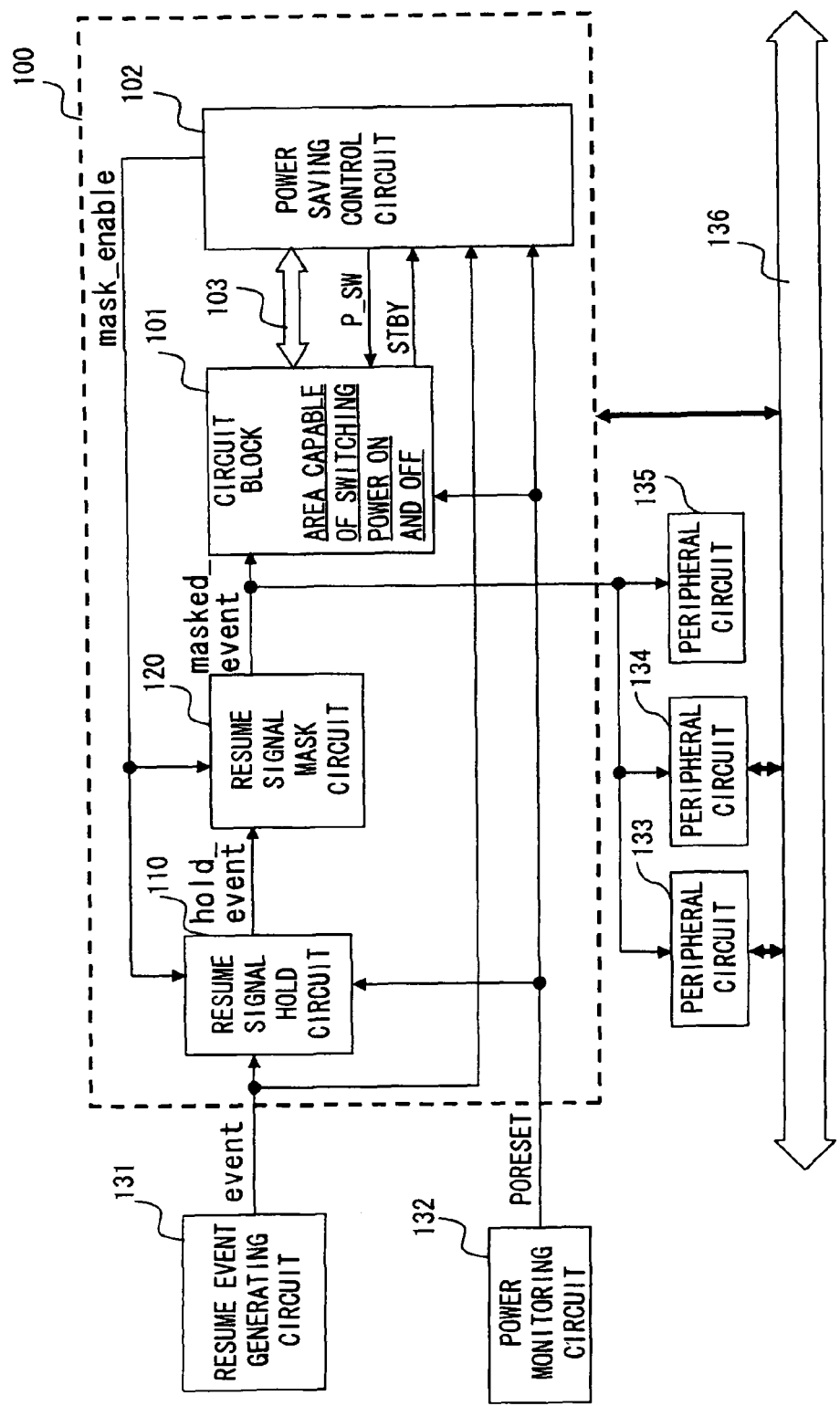
FIG. 1 shows a schematic configuration of a first exemplary embodiment of semiconductor integrated circuit of the present invention.

FIG. 1 shows the schematic configuration of a first exemplary embodiment of the semiconductor integrated circuit in accordance with the present invention.

A semiconductor integrated circuit 100 includes a circuit block 101, a power saving control circuit (resume controller) 102, a resume signal hold circuit 110, a resume signal mask circuit 120, and an interface 103.

In FIG. 1, a system bus 136, peripheral circuits 133 and 134 connected to the system bus 136, a peripheral circuits 135 that are not connected to the system bus 136, a resume event generating circuit 131, and a power monitoring circuit 132 are mere examples of external circuits related to the semiconductor integrated circuit 100. These circuits 131-136 may be provided as the external part of the integrated semiconductor circuit 100 or may be provided as the internal part of the integrated semiconductor circuit 100. Furthermore, these circuits 131-136 can be modified according to the particular system configuration.

The circuit block 101 has any given functions, for example central processing and digital signal processing, and is an area for which the power can be turned ON and OFF. The circuit block 101 outputs a stand-by transition signal (STBY) to the power saving control circuit 102 before stopping the operation of the circuit block 101 itself. As a specific example, in the case where the circuit block 101 is a central processing unit, the circuit block 101 outputs the STBY to reduce the power consumption when there is no command to execute. Furthermore, the circuit block 101 resumes its operation when it receives a resume event signal from other circuits.

The power saving control circuit 102 controls the switching of the power supply to the circuit block 101 and manages the internal data of the circuit block 101. When the power saving control circuit 102 receives the STBY signal from the circuit block 101, the power saving control circuit outputs a control signal P_SW having a L level and turns off the power supply to the circuit block 101 after necessary preprocessing for turning off the operation of the circuit block 101 has been completed. Examples of the necessary preprocessing for turning off the operation of the circuit block 101 include obtaining the internal data of the circuit block via the interface 103, setting internal registers of the circuit block 101 according to the necessity, and so forth.

Furthermore, when the power saving control circuit 102 receives the resume event signal from the resume event generating circuit 131 during the stand-by mode of the circuit block 101, the power saving control circuit 102 outputs the control signal P_SW having a H-level to turn on the circuit block 101. Simultaneously, the power saving control circuit performs necessary data setting for resuming the circuit block 101 via the interface 103. As a specific example, the power saving control circuit brings back the internal data to the circuit block and performs necessary setting of the internal register of the circuit block 101 via the interface 103.

Here, the power saving control circuit 102 performs control such that no external resume event signal is input to the circuit block 102 from when the STBY is output from the circuit block 102 to when the resume preprocessing has been completed. In other words, the power saving control circuit 102 outputs a Mask Enable signal having a H-level from when the STBY is output from the circuit block 102 to when the resume preprocessing is completed. The mask enable signal is input to the resume signal hold circuit 110 and the resume signal mask circuit 120.

Figure 2:
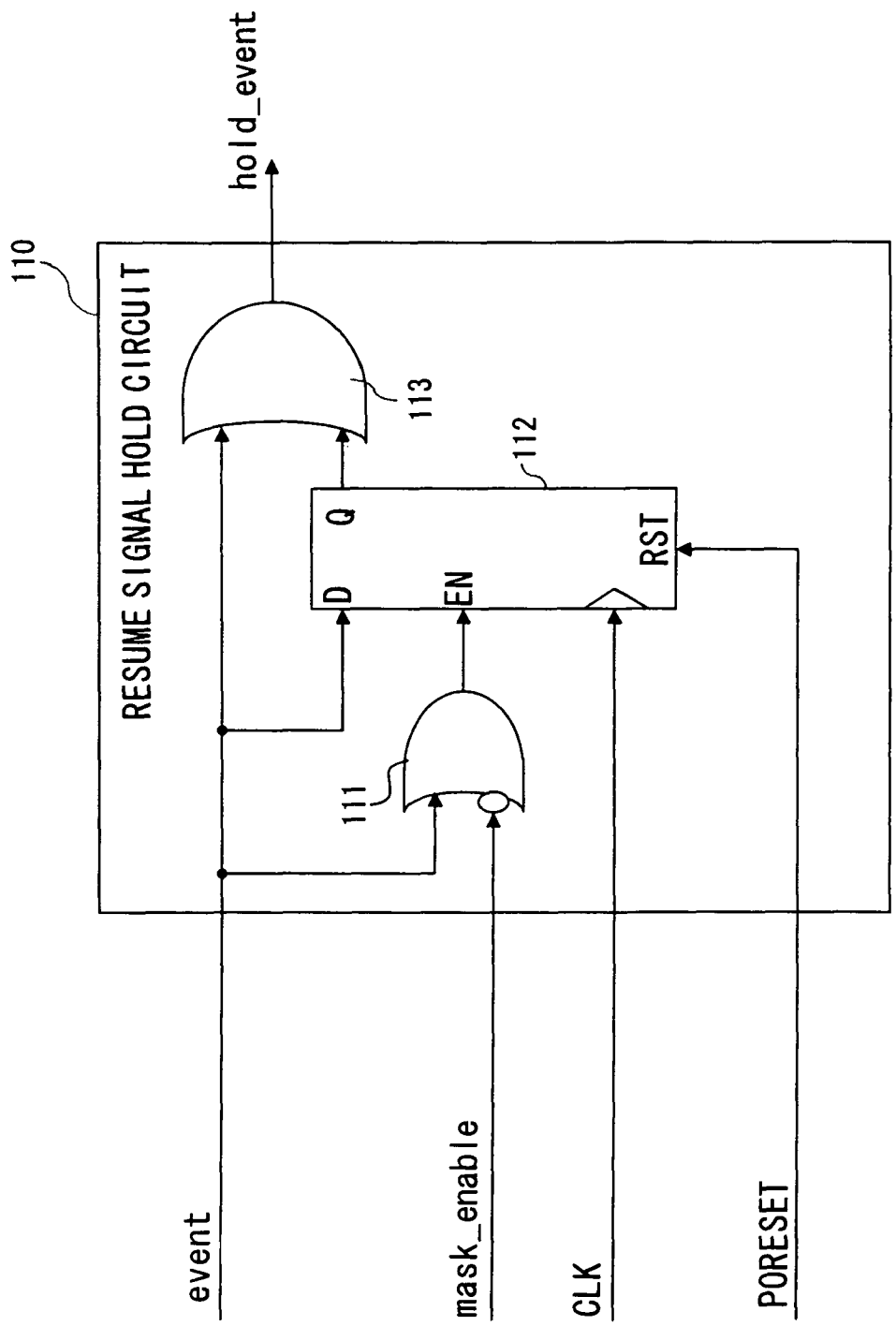
FIG. 2 shows a circuit diagram of the resume signal hold circuit.

The resume signal hold circuit 110 holds the H-level of a resume event signal that is input while the mask enable is at a H-level. FIG. 2 shows the circuit diagram of the resume signal hold circuit 110. The resume signal hold circuit 110 includes a first OR circuit 111, a flip-flop circuit 112 and a second OR circuit 113. The resume event signal is input to one input terminal of the first OR circuit 111 and the inverted signal of the mask enable signal is input to the other input terminal. An output from the first OR circuit 111 is input to the enable terminal (EN) of the flip-flop circuit 112.

When a H-level is being input to the enable terminal, the flip-flop circuit 112 accepts data from the D terminal at the clock timing and outputs it from the Q terminal. On the other hand, when an L-level is being input to the enable terminal, the flip-flop terminal does not accept data from the D terminal and retains the internal data, and outputs the internal data from the Q terminal. The resume event signal is input to the D terminal of the flip-flop 112.

The resume event signal is input to one input terminal of the second OR circuit 113 and the output Q from the flip-flop 112 is input to the other input terminal. An output signal from the second OR circuit is an output signal (hold_event) of the resume signal hold circuit.

Figure 3:
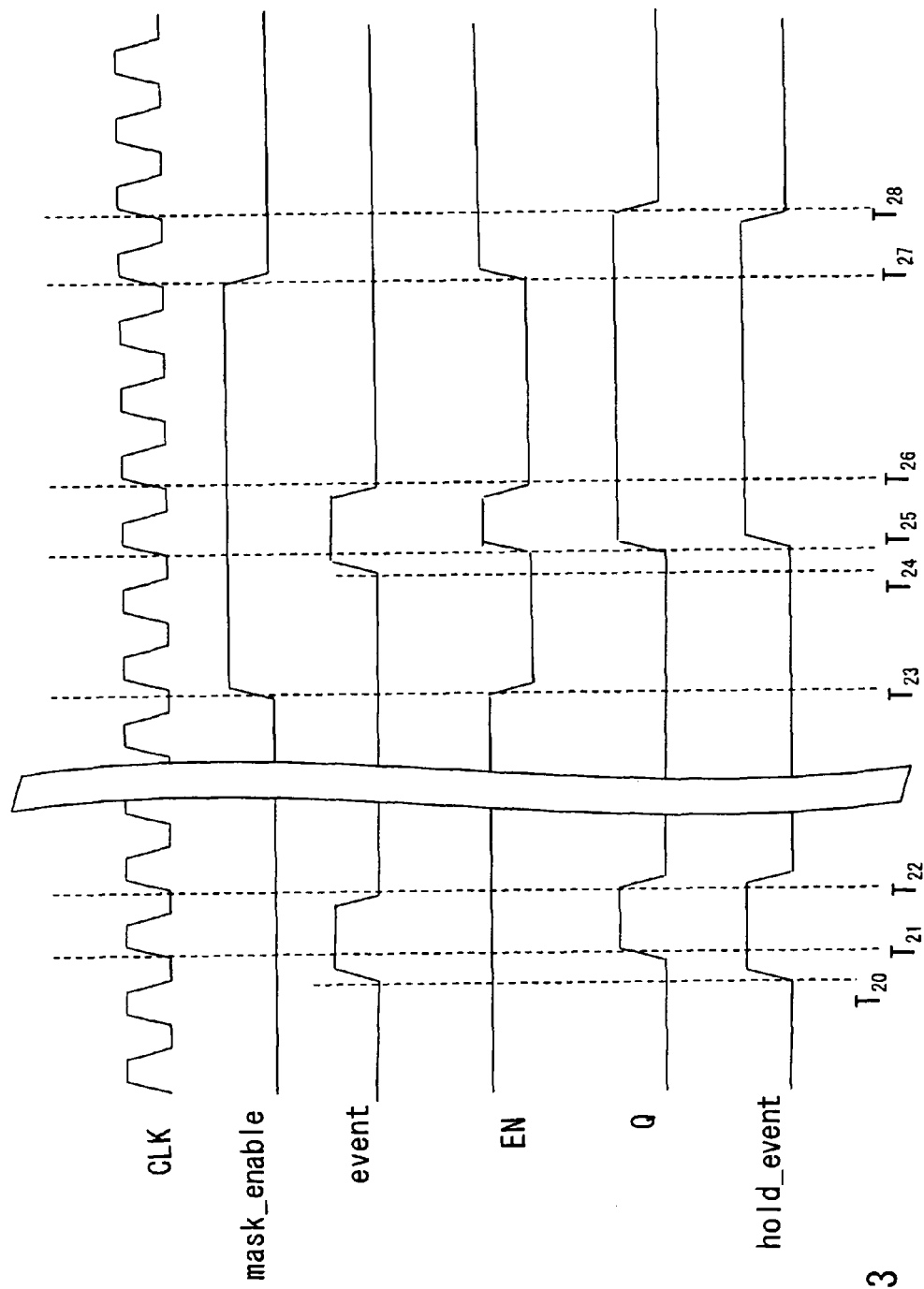
FIG. 3 is a timing chart showing a process of the resume signal hold circuit.

FIG. 3 is a timing chart showing an operation of the resume signal hold circuit 110.

In FIG. 3, the mask enable is at a H-level from a time T23 to a time T27, and the resume event signal becomes a H-level at the timing of a time T20 and T24. Because the mask enable signal is at a L level until the time T23, the output of the first OR circuit 111 is a H level irrespective of the event signal input to the other input terminal. In other words, until the time T23, a H level is input to the enable terminal of the flip-flop circuit 112. Therefore, the flip-flop circuit 112 accepts data from the D terminal and outputs the date from the Q terminal. For example, at a time T21, the resume event signal having a H-level is being input to the D terminal. Therefore, the flip-flop circuit 112 accepts the H-level and output a H level from the Q terminal. Then, at the time T22 at which the clock rises again, the assertion of the resume event signal is already disengaged and the resume event signal is thereby at a L-level. Therefore, the flip-flop circuit 112 outputs a L level from the Q terminal.

The resume event signal and the output Q of the flip-flop circuit 112 are input to the second OR circuit 113. The output of the resume signal hold circuit 110, that is, the output of the second OR circuit becomes a H-level from the time T20 to the time T22.

Meanwhile, when the mask enable signal becomes a H-level at a time T23, one input of the first OR circuit 111 changes to a L-level. In this case, the output of the first OR circuit 111 conforms to the event signal that is input to the other input terminal.

In this state, the event signal changes to a H-level at a time T24. Then, since the output of the first OR circuit becomes a H-level, the H level is input to the enable terminal of the flip-flop circuit 112. Since the enable terminal is at a H-level, the flip-flop circuit 112 accepts the date from the D terminal at the rising edge of clock (time T25). Since the resume event signal is being input to the D terminal, the flip-flop circuit 112 accepts the H level of the resume event signal and outputs the H-level from the Q terminal.

Here, when the H-level of the resume event signal is canceled, the input to the enable terminal of the flip-flop circuit 112 also changes to a L-level. Then, the flip-flop circuit 112 does not accept data from the D terminal and outputs the internal data from the Q terminal. More specifically, the internal state of the flip-flop circuit 112 is held at a H-level and the H-level signal is output from the Q terminal. The enable terminal changes to H level next time at a time T27 at which the H-level of the mask enable is canceled. Therefore, the flip-flop circuit 112 outputs the H-level from the Q terminal until the flip-flop circuit 112 taken in a resume event signal having a L-level at the timing (time T28) at which the clock rises again after the masking of the D terminal is cancelled at the time T27.

As described above, with the configuration of the resume signal hold circuit 110, an assertion (H-level) of the resume event signal is accepted while the mask enable signal is at a H-level and the assertion (H-level) of the resume event signal is continuously held even after the mask enable signal changes to L level.

Figure 4:
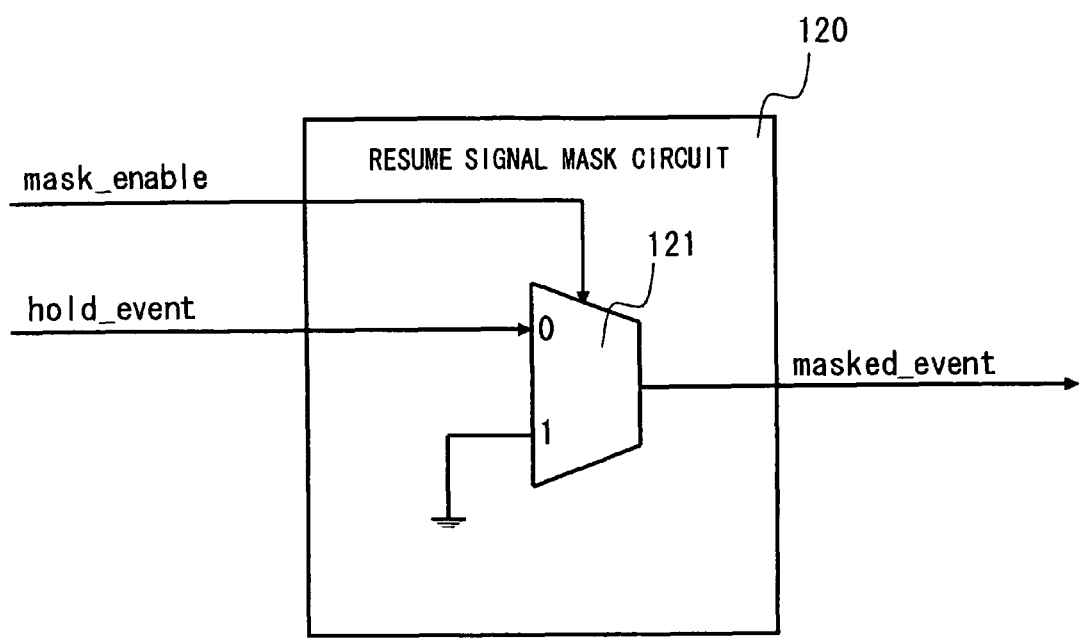
FIG. 4 shows a circuit diagram of the resume signal mask circuit.

The resume signal mask circuit 120 is provided at a stage preceding the circuit block 101. FIG. 4 shows the circuit diagram of the resume signal mask circuit 120. The resume signal mask circuit 120 is formed by a selector 121. The output (hold_event) from the resume signal hold circuit 110 is input to an input terminal "0" of the selector 121, and an input terminal "1" is fixed to a ground potential. Furthermore, the mask enable signal (Mask_enable) is input to the selector 121 as the selection signal. The input terminal "1" is selected and the ground level is output when the Mask_enable is at a H-level. The input terminal "0" is selected and the hold_event signal is output when the Mask_enable is at a L-level. Then, when the Mask_enable signal is at a H-level, the resume event signal is not input to the circuit block 101. Hereinafter, the resume event signal through the resume signal mask circuit 120 is called "Masked_event signal".

The interface 103 is a connecting medium for transmitting data between the circuit block 101 and power saving control circuit 102, and the configuration thereof may be arbitrarily designed.

The resume event generating circuit 131 is a circuit that generates a resume event instructing a resumption of operation of the circuit block 101 and includes a master circuit, a timer circuit and so forth. As a specific example for the resume event signal, an interrupt signal output from other master circuits to instruct a resumption of a CPU, a reset signal output form a watch-dog-timer and instruct initialization of the circuit block and so forth are exemplified.

The power monitoring circuit 132 is a circuit that monitors the power supply state of whole system and generates a power-on-reset signal (PORESET), and is formed by reset ICs or the like. When the PORESET is asserted, the whole system is initialized and the holding of the resume event signal by the resume signal hold circuit 110 is cleared. (More specifically, the flip-flop circuit 112 is initialized.)

The system bus 136 is a connecting medium for transmitting address signal, data and so forth. The peripheral circuits 133 and 134 connected to the system bus 136 are an external memory, a DMA controller, DSP and so forth. The peripheral circuit 135, which is not connected to the system bus 136, is, for example, a simple display device. The peripheral circuits 133-135 are mere examples and can be modified according to the particular system requirement.

Furthermore, an output from the resume signal hold circuit 110 via the resume signal mask circuit 120 is branched to be input to the peripheral circuits 133-135.

Figure 5:
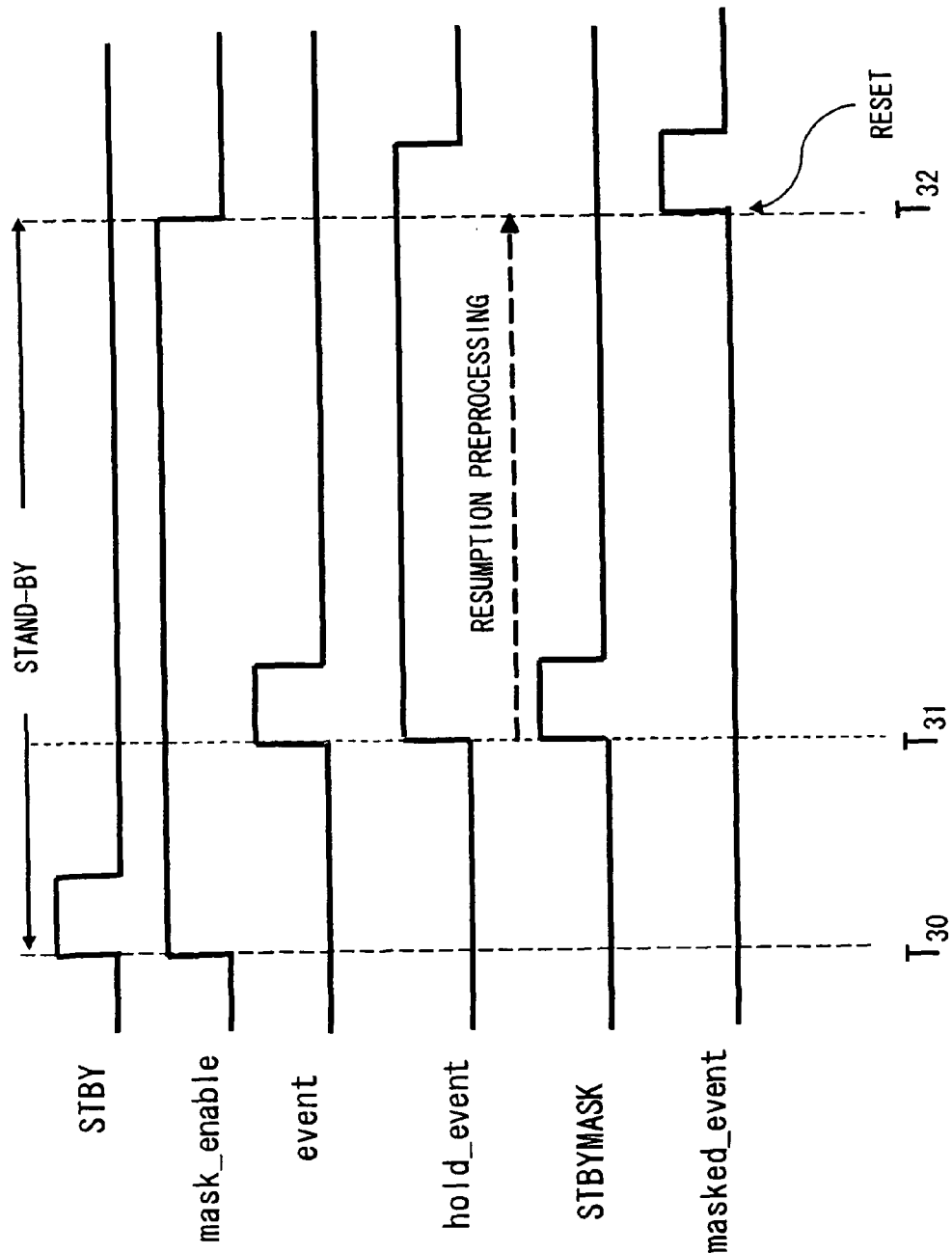
FIG. 5 is a timing chart for explanation of the operation of the first exemplary embodiment.

Next, an operation of the first exemplary embodiment is explained. FIG. 5 is a timing chart for explanation of the operation of the first exemplary embodiment. The circuit block outputs the STBY to the power saving control circuit 102 at a time T30. The STBY signal is used to instruct transition to a stand-by mode. Then, the power saving control circuit 102 outputs the Mask_enable having a H-level, and obtains the internal data of the circuit block 101 via the interface 103. The Mask_enable signal having a H-level is input to the resume signal hold circuit 110 and the resume signal mask circuit 120. In this state, the resume signal hold circuit 110 holds the resume event signal having a H-level when the signal is externally. Furthermore, the resume signal mask circuit 120 masks the input signal.

The resume event signal (event) is externally input at a time T31. Then, the resume signal hold circuit 110 holds a H-level (assert) of the event signal. Furthermore, the resume event signal is branched and is also input to the power saving control circuit 102.

When the power saving control circuit 102 receives the resume event signal (event), the power saving control circuit 102 turns on the power supply to the circuit block 101 and performs necessary data setting for the resumption of the circuit block 101. More specifically, the power saving control circuit 102 brings back the internal data to the circuit block 101 and performs register setting according to the necessity. Then, the power saving control circuit 102 cancelled the assertion of the Mask_enable after the competition of the necessary setting for the resumption of the circuit block 101 (T32).

When the Mask_enable signal becomes a L-level, the mask processing by the resume signal mask circuit 120 is cancelled. Then, the resume event signal that is held by the resume signal hold circuit 110 is input to the circuit block 101. Furthermore, the resume event signal via the resume signal mask circuit 120 is input to the circuit block 101 and also input to the peripheral circuits 133-135 as the initializing reset signal. As a result, after the resume of the circuit block 101, the related peripheral circuits 133-135 are reset to the initial state. By doing so, inconsistency of the whole system can be prevented.

According to the first exemplary embodiment having the above-mentioned configuration, the following advantageous effects can be obtained. Even if the resume event signal of a edge detection type is input during the stand-by mode, the resume event can be reliably asserted and executed because the resume event signal is held by the resume signal hold circuit 110.

Furthermore, if the resume event signal is a reset signal that instructs initialization of the circuit block 101, the related peripheral circuits as well as the circuit block 101 can be reset to the initial states simultaneously because the output signals of the resume signal mask circuit 120 (Masked_event) are also input to the related peripheral circuits 133-135. As a result, the reset timing of all the circuits are the same and the synchronization of all the circuits can be maintained.

Second Exemplary Embodiment

Next, second exemplary embodiment of the present invention will be described.

While the most of the configuration of the second exemplary embodiment correspond to those of the first exemplary embodiment, the second exemplary embodiment has a characteristic feature in that the second exemplary embodiment includes an event hold circuit 210 for holding an interrupt event signal and a reset hold circuit 220 for holding the reset signal. In the first exemplary embodiment, a case where the resume event signal of an edge detection type is held is explained. A reset signal is an example of the edge detection type resume signal. If an event signal is a level detection type signal, any particular countermeasure is not necessary because the event signal can be detected after the resumption. However, recently, edge detection type event signals are more frequently used. If these edge detection type event signals are input during the stand-by mode, the event signals cannot be input to the circuit block 101 due to the mask processing. Therefore, this causes such a problem that the event command cannot be executed.

Figure 6:
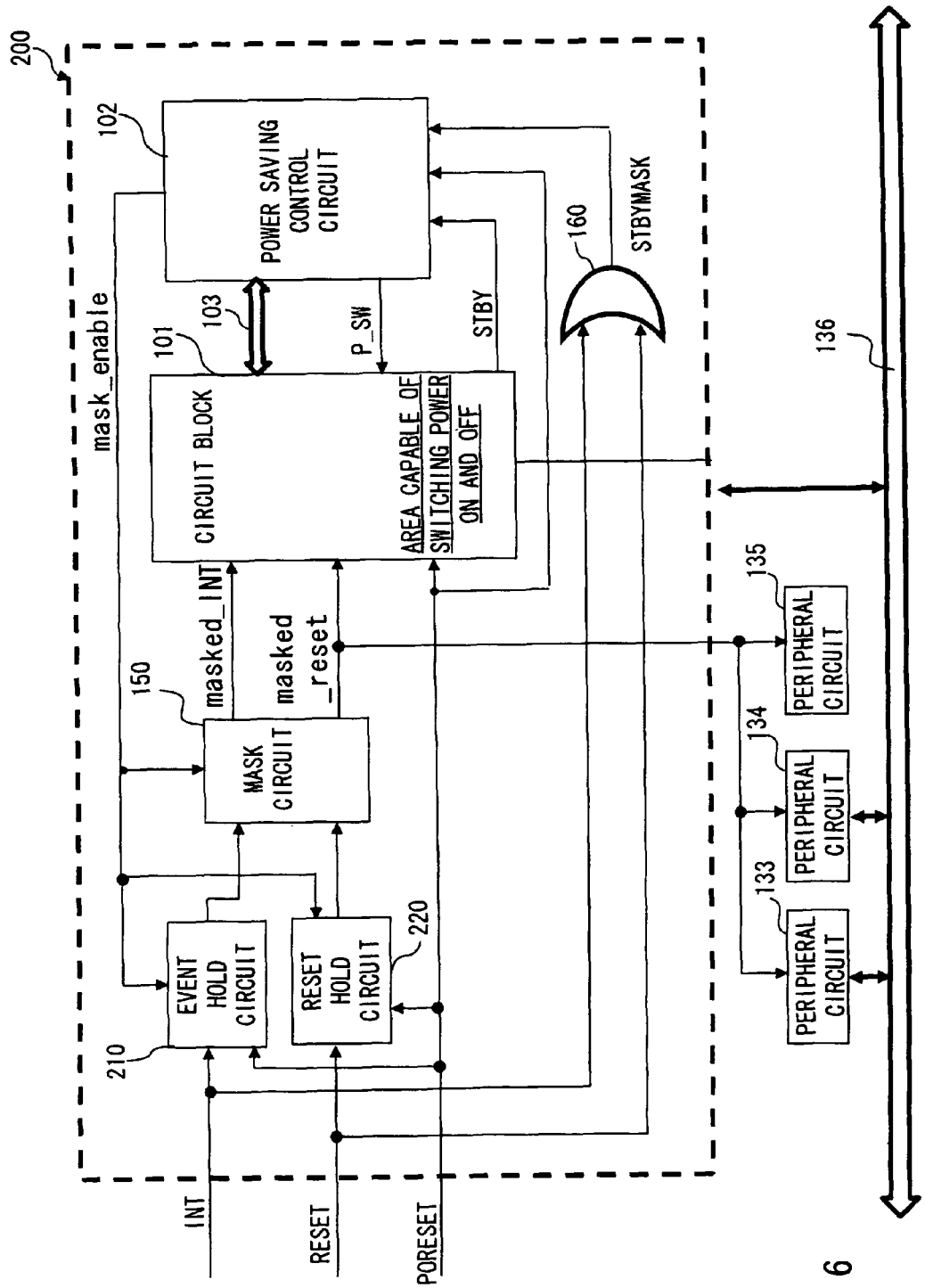
FIG. 6 shows a second exemplary embodiment of the present invention.
Figure 7:
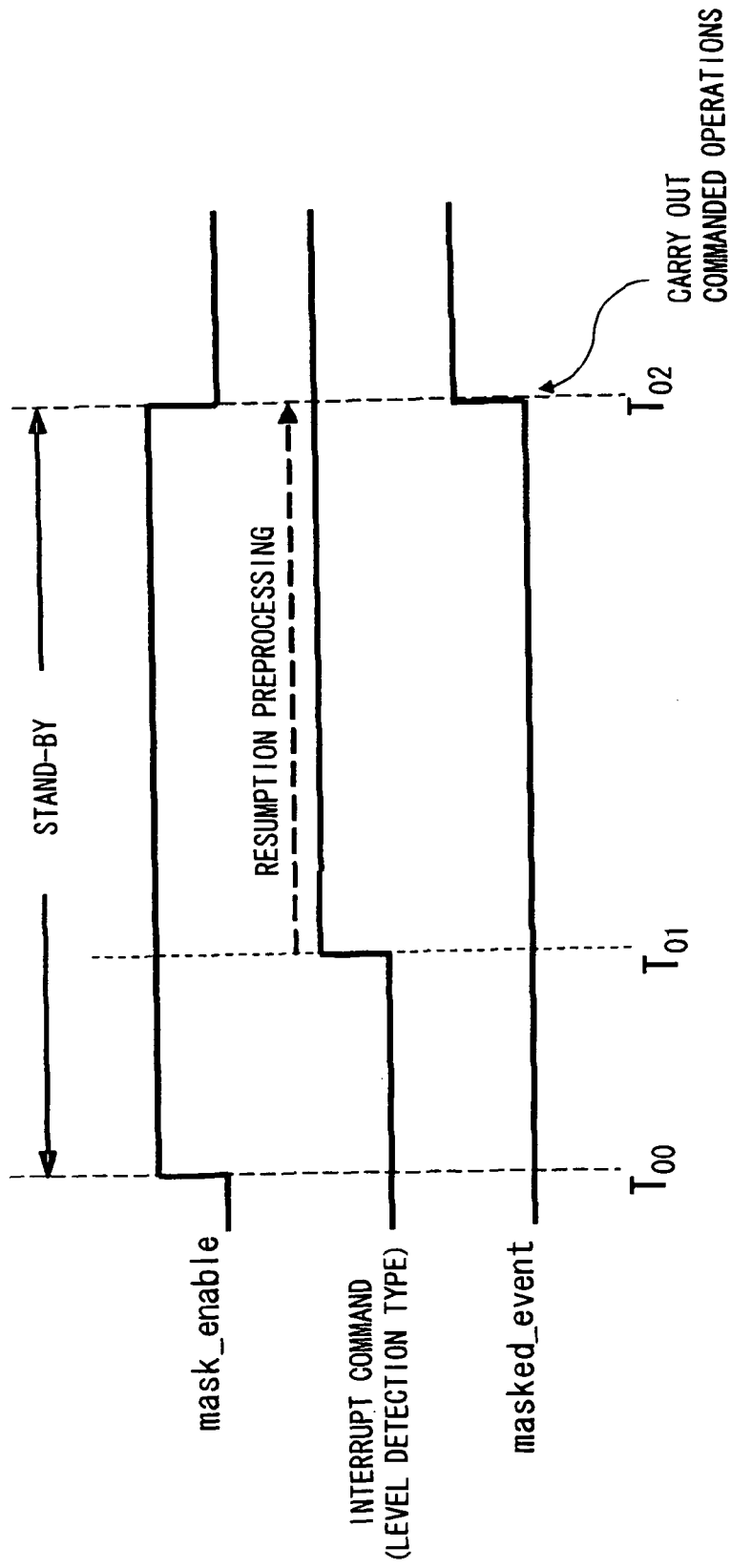
FIG. 7 is a timing chart for explaining the related art.
Figure 8:
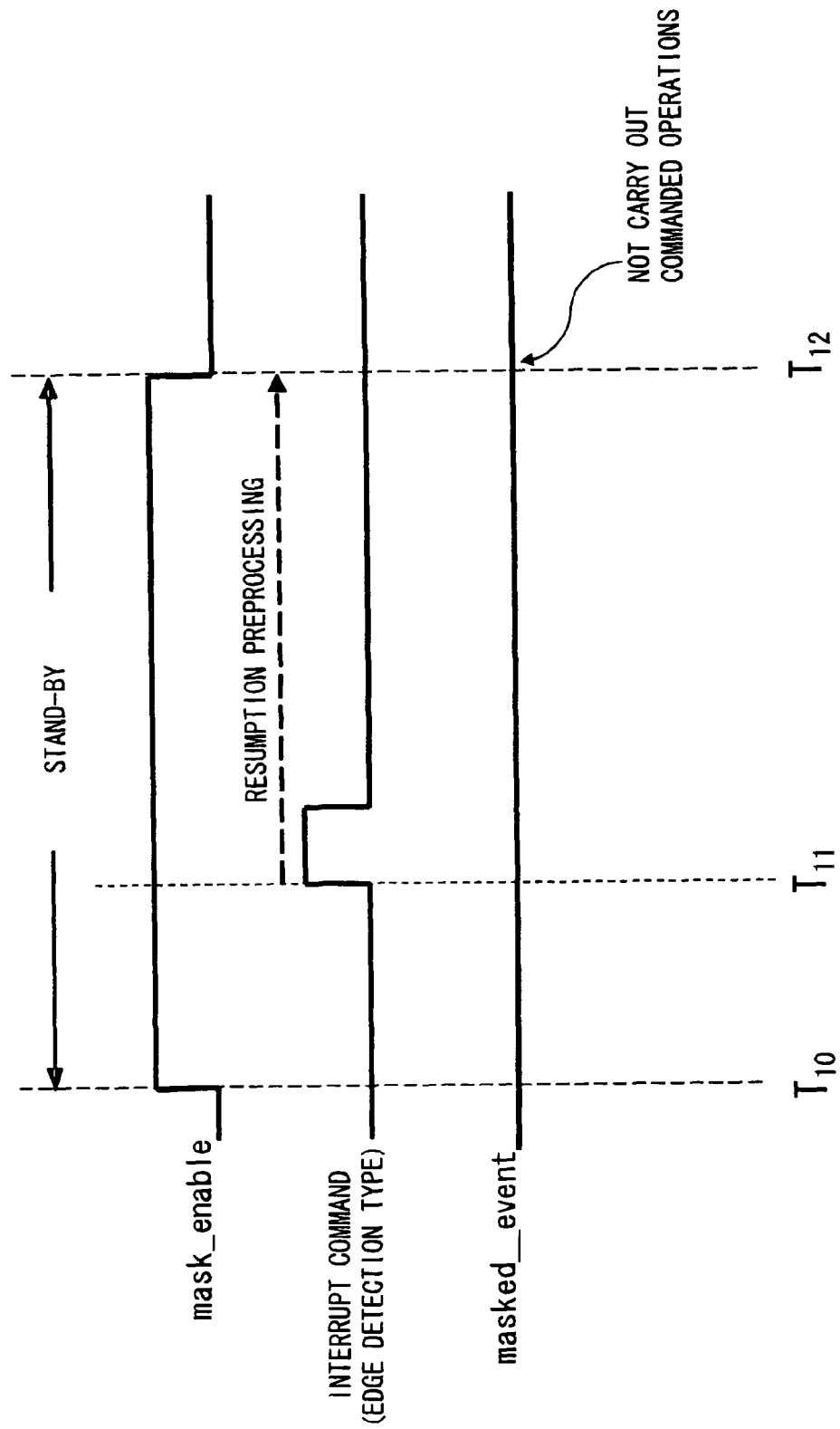
FIG. 8 is a timing chart for explaining the related art.

In this regard, as shown in FIG. 6, the second exemplary embodiment includes the event hold circuit 210 for holding the assertion of the interrupt event signal (INT) and the reset hold circuit 220 for holding the reset signal. For example, the reset signal (RESET) corresponds to the resume event signal in the first exemplary embodiment. Furthermore, the interrupt event signal (INT) can be either a level detection type or an edge detection type.

Internal configurations of the event hold circuit 210 and the reset hold circuit 220 can be similar to that of the resume signal hold circuit 110 of the first exemplary embodiment. Furthermore, the mask enable signal from the power saving control circuit 102 is input to the event hold circuit 210 and the reset hold circuit 220. As a result, the interrupt signal having a H-level is held when the mask enable signal is at a H-level.

Here, the resume signal hold circuit is formed from the event hold circuit 210 and the reset hold circuit 220.

An output (hold_INT) from the event hold circuit 210 and an output (hold_RESET) are input to the mask circuit 150. When the mask enable signal is at a H-level, the mask circuit 150 masks these input signals and outputs a L-level signal irrespective of the input signals As a result, when the mask enable signal is at a H-level, no external signal is input to the circuit block 101. Note that when the mask enable signal is at a L-level, the mask circuit 150 outputs the signals that are input from the event hold circuit 210 and the reset hold circuit 220 without performing any processing. Hereinafter, the output from the event hold circuit 210 via the mask circuit 150 is called Masked_INT, and the output from the reset hold circuit 220 via the mask circuit 150 is called Masked_RESET.

Furthermore, the second exemplary embodiment includes an OR circuit 160. The interrupt event signal (INT) is input to one input terminal of the OR circuit 160 and the reset signal (RESET) is input to the other terminal. The output from the OR circuit 160 is input to the power saving control circuit 102. The H-level signal from the OR circuit 160 is input to the power saving control circuit 102 as a stand-by mask. In other words, when the H-level signal from the OR circuit 160 is input to the power saving control circuit 102, the power saving control circuit 102 executes necessary processing for the resumption of the circuit block 101 irrespective of the Stand-by transition signal form the circuit block 101.

Furthermore, the output from the reset hold circuit 220 via the mask circuit 150 is branched and input to the peripheral circuits 133-135.

According to the second exemplary embodiment, even if the edge detection type event signal (INT) is input during the stand-by mode, the event signal is held until the cancelling of the stand-by mode. Thus, the event is reliably executed after the resumption of the circuit block 101. Recently, the edge detection type event signals being frequently used. Such an event is reliably executed after the cancelling of the stand-by mode according to the second exemplary embodiment because the event signal is also held by the event hold circuit 210.

The present invention is not limited to the above exemplary embodiments, and various modifications can be made without departing from the scope of the present invention. In the above exemplary embodiments, a case where the internal data of the circuit block is saved into the power saving control circuit is explained. Alternatively, the internal data of the circuit block may be saved in a nonvolatile back-up memory. Furthermore, the internal data of the circuit block may be saved in a retention flip-flop circuit, which does not need to be rewritten even if the voltage is lowered.

Needless to say, examples of circuits for which the power supply can be turned ON/OFF includes, in addition to the central processor, any other circuit units including circuit units for various calculations, graphic processing, wireless radio communication and so forth.

Although a H-level is used as assertion level of signals in the above description, a L-active signal can be also used as the assertion signal in the present invention.

In the above exemplary embodiments, the reset signal (RESET) and the interrupt event signal are used as examples of the resume event signal that is externally input during the stand-by state, any other signals may be also used as the resume event signal. The first and second exemplary embodiments can be combined as desirable by one of ordinary skill in the art. While the invention has been described in terms of several exemplary embodiments, those skilled in the art will recognize that the invention can be practiced with various modifications within the spirit and scope of the appended claims and the invention is not limited to the examples described above. Further, the scope of the claims is not limited by the exemplary embodiments described above. Furthermore, it is noted that, Applicant's intent is to encompass equivalents of all claim elements, even if amended later during prosecution.

What is claimed is:

1. A semiconductor integrated circuit comprising:
   a circuit block capable of stopping power consumption at a time of an operation-stopped state, and starting an operation and performing a specific process upon receiving a resume event signal instructing a start of an operation;
   a power saving control circuit that sets necessary data in the circuit block in the operation-stopped state when the resume event signal is input, the necessary data being required to resume an operation of the circuit block;
   a resume signal mask circuit that masks an input of the resume event signal to the circuit block during a period in which the circuit block is in the operation-stopped state and a period in which the power saving control circuit is setting the necessary data in the circuit block;
   a resume signal hold circuit that holds a state of the resume event signal at least until after the data has been set in the circuit block and outputs the resume event signal to the circuit block through the resume signal mask circuit if the resume event signal is input during a period in which the circuit block is in the operation-stopped state and a period in which the power saving control circuit is setting the necessary data in the circuit block.

2. The semiconductor integrated circuit according to claim 1, wherein the resume signal mask circuit and the resume signal hold circuit are controlled by a control signal from the power saving control circuit.

3. The semiconductor integrated circuit according to claim 2, wherein the resume event signal comprises an edge detection type signal.

4. The semiconductor integrated circuit according to claim 2, wherein
   the resume event signal comprises a reset signal that instructs initialization of the semiconductor integrated circuit, and
   the resume event signal is input to the circuit block via the resume signal hold circuit and the resume signal mask circuit, and can be also input to a circuit other than the circuit block.

5. The semiconductor integrated circuit according to claim 2, wherein the resume signal hold circuit comprises an event hold circuit that holds an assertion of a interrupt event signal.

6. The semiconductor integrated circuit according to claim 1, wherein the resume event signal comprises an edge detection type signal.

7. The semiconductor integrated circuit according to claim 1, wherein
   the resume event signal comprises a reset signal that instructs initialization of the semiconductor integrated circuit, and
   the resume event signal is input to the circuit block via the resume signal hold circuit and the resume signal mask circuit, and can be also input to a circuit other than the circuit block.

8. The semiconductor integrated circuit according to claim 1, wherein the resume signal hold circuit comprises an event hold circuit that holds an assertion of a interrupt event signal.

9. A semiconductor integrated circuit comprising:
   a circuit block capable of switching between a normal operation mode and a stand-by mode;
   a resume signal hold circuit that holds an assertion of the event when a resume event signal to the circuit block is detected;
   an mask circuit that masks the resume event signal to the circuit block during a instructed period, the mask circuit being provided between the circuit block and the resume signal hold circuit; and
   an resume controller that sets necessary data for recovery of the circuit block, the necessary data being required when the circuit block recovers from the stand-by mode to the normal operation mode,
   wherein the resume controller causes the resume signal hold circuit to hold the assertion of the event and causes the mask circuit to mask an input of the resume event signal to the circuit block during a period in which the circuit block is in a stand-by mode and a period in which the power saving control circuit is setting the necessary data in the circuit block, and
   the resume controller causes the resume signal hold circuit to cancel holding the assertion of the event signal after canceling masking of the mask circuit at the time of completion of the setting of the necessary data in the circuit block.

10. The semiconductor integrated circuit according to claim 9, wherein the resume event signal comprises an edge detection type signal.

11. The semiconductor integrated circuit according to claim 9, wherein
    the resume event signal comprises a reset signal that instructs initialization of the semiconductor integrated circuit, and
    the resume event signal is input to the circuit block via the resume signal hold circuit and the resume signal mask circuit, and can be also input to a circuit other than the circuit block.

12. The semiconductor integrated circuit according to claim 9, wherein the resume signal hold circuit comprises an event hold circuit that holds an assertion of a interrupt event signal.

* * * * *